United States Patent
Ikuhara et al.

(10) Patent No.: US 6,939,433 B2
(45) Date of Patent: Sep. 6, 2005

(54) SAMPLE PROCESSING APPARATUS AND SAMPLE PROCESSING SYSTEM

(75) Inventors: Shoji Ikuhara, Hikari (JP); Hideyuki Yamamoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 329 days.

(21) Appl. No.: 10/228,039

(22) Filed: Aug. 27, 2002

(65) Prior Publication Data

US 2004/0040657 A1 Mar. 4, 2004

(51) Int. Cl.$^7$ .......................... H05H 1/00; C23C 16/00; C23F 1/00; H01L 21/00
(52) U.S. Cl. ........................ 156/345.24; 156/345.25; 118/712; 216/60; 438/5
(58) Field of Search ................ 156/345.24, 345.25, 156/345.26, 345.27, 345.28; 118/695, 712, 696; 216/59, 60, 61; 438/5, 7, 8, 14, 16

(56) References Cited

U.S. PATENT DOCUMENTS

| | | | | |
|---|---|---|---|---|
| 5,642,296 A | * | 6/1997 | Saxena | 702/84 |
| 5,685,942 A | * | 11/1997 | Ishii | 156/345.48 |
| 5,711,843 A | * | 1/1998 | Jahns | 156/345.24 |
| 5,910,011 A | * | 6/1999 | Cruse | 438/16 |
| 5,971,591 A | * | 10/1999 | Vona et al. | 700/220 |
| 6,197,116 B1 | * | 3/2001 | Kosugi | 118/712 |

FOREIGN PATENT DOCUMENTS

JP    08-005542    1/1996

* cited by examiner

Primary Examiner—Parviz Hassanzadeh
(74) Attorney, Agent, or Firm—Antonelli, Terry, Stout & Kraus, LLP

(57) ABSTRACT

It is an object of the invention to provide a vacuum processing device and a vacuum processing system capable of improving the accuracy for the function of estimating the result of processing of samples based on the monitored values for the processing state of the samples, improving the forecasting accuracy and thus improving the yield of products. The system comprises a function of monitoring processing parameters for samples, a function of estimating the processing characteristics of the samples based on the monitored parameters, a function of conducting communication with a measuring device for measuring the processing state of the samples after processing and a function of updating the measuring conditions by the measuring device in accordance with the processing characteristics of the samples estimated from the information by monitoring.

9 Claims, 8 Drawing Sheets

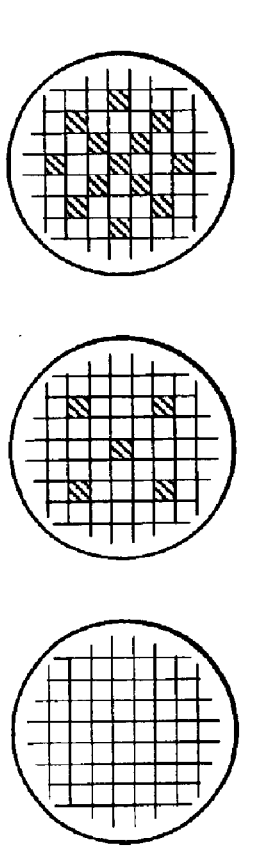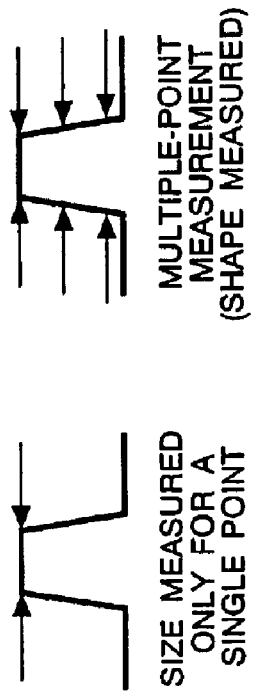

FIG. 6A

CORRELATION DATABASE BETWEEN
O2 INGREDIENT AMOUNT AND FINISHED
SHAPE IN THE PRODUCT

| O2 INGREDIENT AMOUNT | FORECAST FINISHED SHAPE |
|---|---|
| +20% | 87° |
| +10% | 89° |
| ... | ... |
| -5% | 90° |
| -10% | 92° |
| ... | ... |

ALLOWABLE RANGE

CORRELATION DATABASE BETWEEN
O2 INGREDIENT AMOUNT AND FINISHED
SHAPE IN THE PRODUCT

| O2 INGREDIENT AMOUNT | FORECAST FINISHED SHAPE |
|---|---|
| +20% | 87° |
| +10% | 89° |
| ... | ... |
| -5% | 90° |
| -7.5% | 91° |
| -10% | 92° |
| ... | ... |

ALLOWABLE RANGE

116

CORRELATION DATABASE BETWEEN DIELECTRIC TANGENT AND ETCHING DISTRIBUTION CHARACTERISTIC IN THE PRODUCT

| tan δ | +10% | +5% | ... | -5% | -10% | ... |
|---|---|---|---|---|---|---|
| FORECAST UNIFORMITY | ±10% | ±5% | ... | ±3% | ±8% | ... |

ALLOWABLE RANGE: +5% to -5%

118

CORRELATION DATABASE BETWEEN DIELECTRIC TANGENT AND ETCHING DISTRIBUTION CHARACTERISTIC IN THE PRODUCT

| tan δ | +10% | +5% | ... | -5% | -6% | -10% | ... |
|---|---|---|---|---|---|---|---|
| FORECAST UNIFORMITY | ±10% | ±5% | ... | ±3% | ±4% | ±8% | ... |

ALLOWABLE RANGE: +5% to -6%

118

SAMPLE PROCESSING APPARATUS AND SAMPLE PROCESSING SYSTEM

BACKGROUND OF THE INVENTION

1. Field of the Invention

This invention relates to a sample processing apparatus and a sample processing system and, more in particular, it relates to a sample processing apparatus and a sample processing system suitable to the use for processing process in a state where refinement of the processing is proceeded.

2. Related Background Art

In vacuum processing device, those apparatus of, for example, introducing an etching gas in a vacuum processing chamber, generating plasma discharge under a reduced pressure and reacting radicals or ions generated in the plasmas to a wafer surface as a material to be processed, thereby conducting etching have been known.

In the dry etching device conducting such processing, etching treatment is conducted under production conditions referred to as a recipe (for example, gas flow rate, gas pressure, charged power and etching time). The recipe is always kept constant in a specified production process (identical process) for semiconductor devices. Sometimes, the one process is divided into several steps and production conditions are changed on every steps. When a dry etching device conducts processing for a process in a semiconductor production step, wafer fabrication is conducted while constantly setting production conditions referred to as the recipe described above on every wafer processing.

Further, it has also been conducted to monitor etching conditions or etching state of a sample, sample an actual shape of a sample, inspecting the same by a measuring device and feed back the result to a sample processing apparatus.

In the recent dry etching process where refinement is, advanced, reaction products of wafers and etching gases are deposited on the inner wall of the processing chamber, unnecessary gases referred to as out gases are generated from the deposits, so that the circumstance in the processing chamber changes with time. Further, the circumstance in the processing chamber changes also by temperature change of parts concerned with the processing chamber and consumption of parts. As described above, various external disturbance factors are present in the dry etching device.

Further, scattering of the dimensional shape of a mask formed in a lithographic step as the preceding step to etching also gives a significant effect on the result of etching. That is, even when etching processing is conducted by using a constant recipe, it is difficult to obtain a predetermined performance because of various external disturbances.

Further, in the wafer sampling inspection and measurement by a measuring device, the measuring accuracy is improved as the number of measuring points increases. However, as the measuring accuracy is made higher, it takes more time for the measurement to reduce the throughput.

SUMMARY OF THE INVENTION

It is an object of the present invention to provide a vacuum processing device and a vacuum processing system capable of suppressing the effects due to change of processing conditions for samples, for example, a state of plasmas.

It is another object of the present invention to provide a vacuum processing device and a vacuum processing system for the improvement of the accuracy in the function of estimating the result of processing for samples based on the monitored values for the processing state of samples, improving the accuracy in forecasting, and improving the yield of products.

It is another object of the present invention to provide a vacuum processing device and a vacuum processing system capable of improving the throughput while conducting sample inspection by a measuring device.

This invention has a feature in providing a function of monitoring processing parameters for a sample, a function of estimating the processing characteristics of the sample based on monitored parameters, a function of conducting communication with a measuring device for measuring processed state of the sample after processing and a function of changing the measuring conditions by the measuring device in accordance with the processing characteristics of the sample estimated by the information from the monitor.

This invention has another feature in providing a function of monitoring etching parameters, a sensor function of monitoring the state of etching processing and, in addition, thereto a function of conducting communication with a measuring device for measuring the etching characteristics after the etching processing, in which it has a function of increasing or decreasing the number of measuring points by a measuring device by etching characteristic estimated from etching parameters or sensor information.

This invention has other feature in providing a judging system having a judging program having a function of estimating the result of etching by monitored etching parameters and the sensor information and a database for storing judged data, and capable of adding the result of new measurement and adding a judging rule.

This invention has a further feature of monitoring the etching state by using a function of monitoring the etching state, inputting the same into the judging system, instructing the increase or decrease of the number of measuring points by the communication function to the judging apparatus based on the judging result, receiving the result of measurement and reflecting the received result on the judging rule and the database, thereby automatically updating the judging system while conducting the etching processing to wafers.

BRIEF DESCRIPTION OF THE DRAWINGS

FIG. 4 is an explanatory view for an example of changing the measuring factors to wafers in the embodiment shown in FIG. 1;

FIG. 6 is an explanatory view showing an example of a database of Embodiment 1;

DETAILED DESCRIPTION OF PREFERRED EMBODIMENTS

Figure 1:
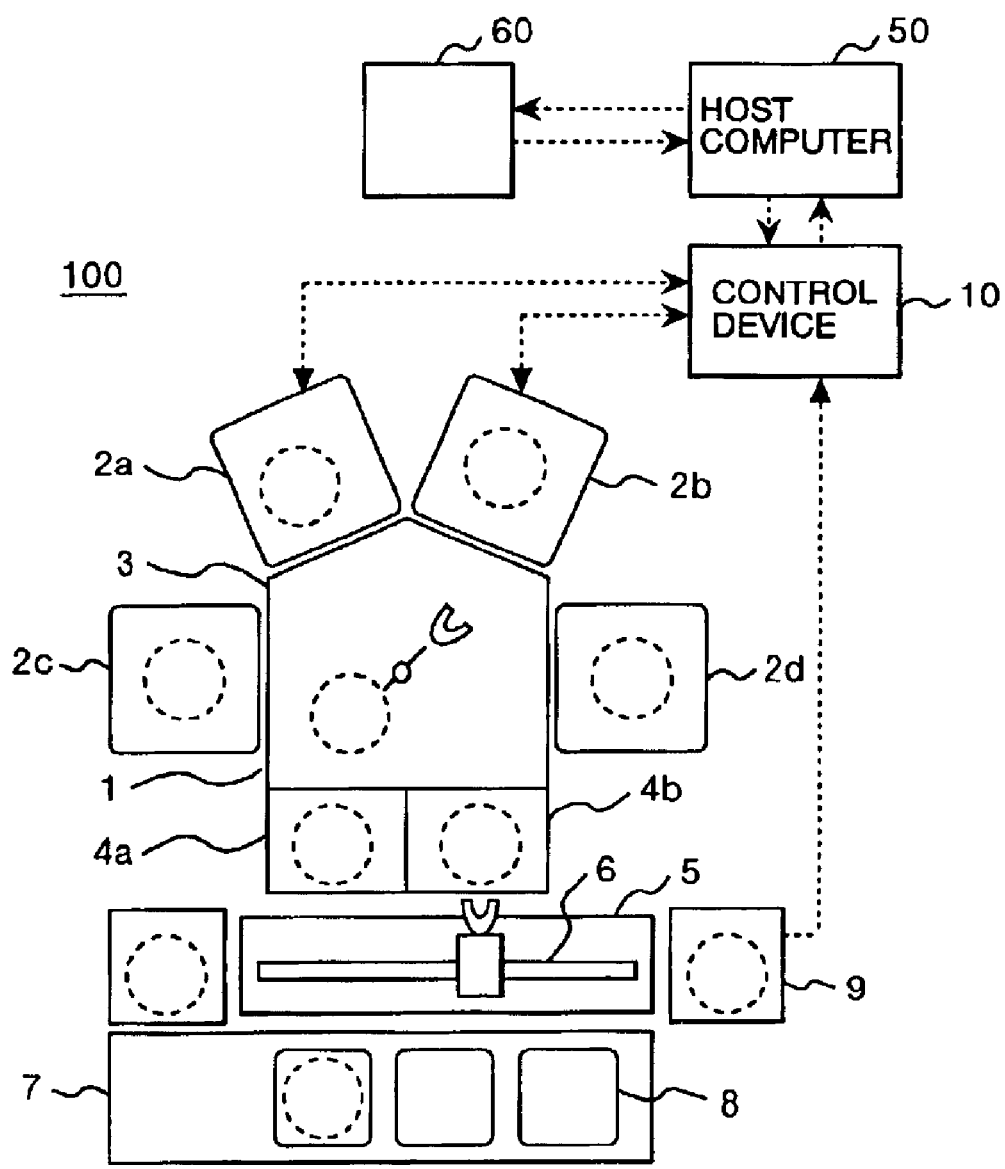
FIG. 1 is a block diagram showing the entire plain view constitution of a sample processing system as an embodiment according to the present invention.
Figure 2:
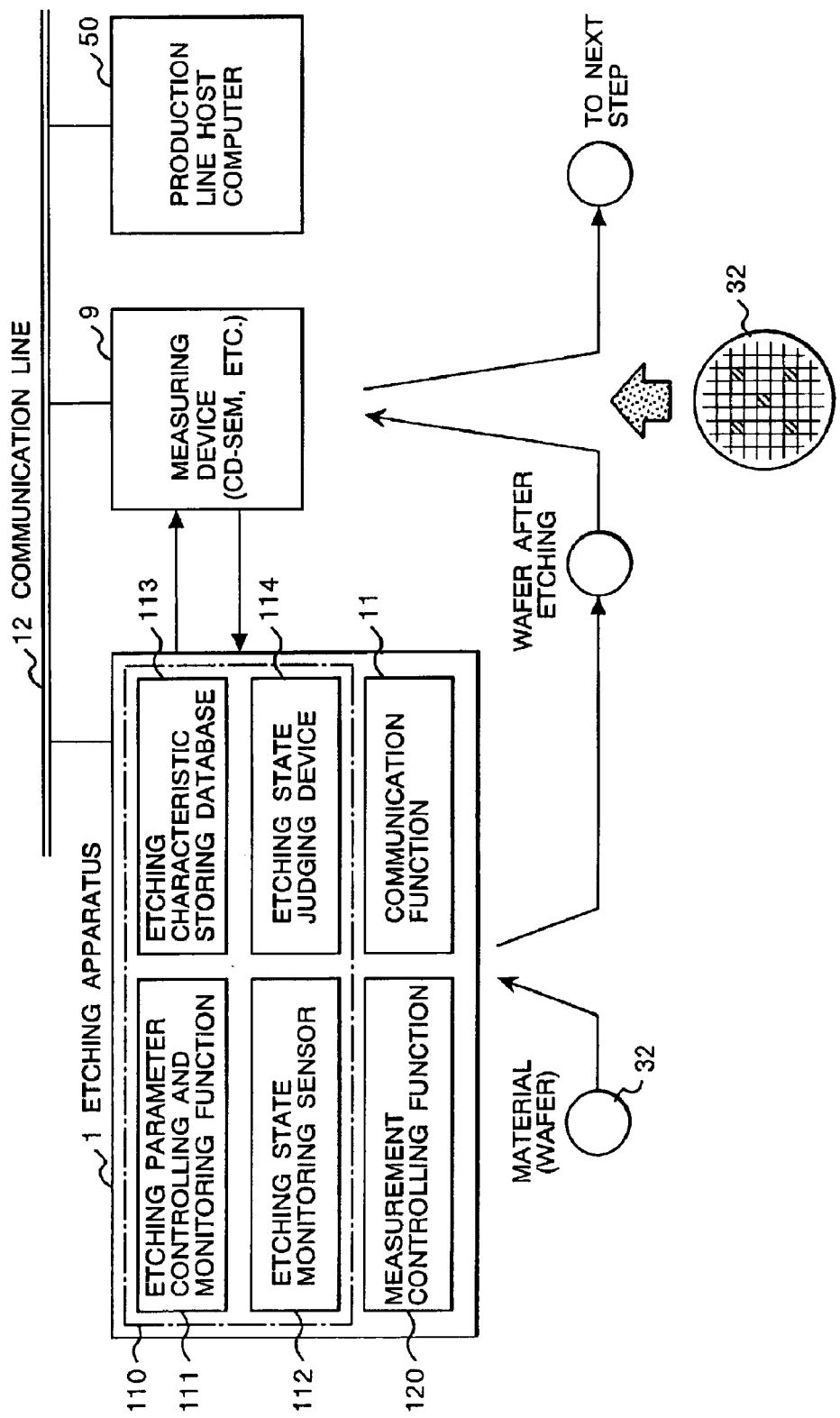
FIG. 2 is a functional block diagram in the embodiment shown in FIG. 1.

FIG. 1 is a block diagram showing the entire plain view constitution of first embodiment using a sample processing system as a dry etching processing system according to the present invention. FIG. 2 is a functional block diagram in the embodiment shown in FIG. 1.

A vacuum processing device 1 of a sample processing system 100 comprises plural plasma processing chambers 2a, 2b, a pre-processing chamber 2c, a vacuum transportation chamber 3 and lock chambers 4a, 4b. The plasma processing chambers 2a, 2b and the lock chambers 4a, 4b are disposed at the periphery of the vacuum transportation chamber 3. A transportation device 5 having a transportation manipulator 6 is disposed to the vacuum processing device 1 on the side of the lock chambers 4a, 4b and further, a cassette table 7 capable of locating plural cassettes 8 is disposed with the sample transportation device 5 being put therebetween. Further, the transportation device 5 is provided with a measuring device 9 and a communication function 11 together with the vacuum processing device 1.

Further, the result of measurement by the measuring device 9 is taken into a control device 10, and the control device 10 sends the result of measurement by way of a communication circuit 12 to a host computer 50. Either the host computer 50 or the control device 10 having a computer has an etching characteristic estimating function 110 and a measurement controlling function 120 as shown in FIG. 2. Further, a portion of the functions may be shared with the computer of the measuring device 9.

The processing conditions for a wafer 32 in the plasma processing chambers 2a, 2b are controlled in accordance with the etching characteristics estimated by the etching characteristic estimating function 110. Further, the measurement controlling function 120 receives information from the etching characteristic estimating function 110 and controls, for example, increase and decrease for the number of measuring points by the measuring device 9. Numeral 60 denotes other processing apparatus controlled by the host computer 50.

In order to attain the etching characteristic estimating function 110, the vacuum processing device system 100 has an etching parameter controlling and monitoring function 111, an etching state monitoring sensor 112, an etching characteristic storing database 113 and a etching state judging device 114 to one of the control device 10, the measuring device 9 or the host computer 50.

The etching parameter controlling and monitoring function 111 controls and monitors the etching parameters in the plasma processing chambers 2a and 2b. Table 1 shows each of the etching parameters and the contents thereof. Further, the etching state monitoring sensor function 112 monitors the etching state in the plasma processing chambers 2a and 2b by way of a group of sensors. Table 1 shows the list of the information for each of monitoring sensor and contents thereof.

TABLE 1

| Category | Name | Content |
|---|---|---|
| Etching parameter (111) | Pressure in etching processing | Giving effect on the etching shape and distribution |
| | RF power source dielectric tangent (tan δ) | Giving effect on the electric field distribution and on etching characteristic distribution |

TABLE 1-continued

| Category | Name | Content |
|---|---|---|
| Monitoring sensor information (112) | RF power source Vpp voltage | Reflecting the plasma state, change of etching characteristic may be considered upon change thereof |
| | Electrode temperature | Giving effect on shape and rate depending on temperature |
| | Cooling gas pressure | Pressure fluctuation giving effect on wafer cooling effect |
| | Plasma emission | Detection for the effect of wall deposition, detection for specified elements affecting the process |
| | Etching residue thickness | Giving effect on the shape by the fluctuation of residual film thickness |

Further, as the etching state monitoring sensor 112, a length measuring SEM device, an optical CD measuring device and a probe inspection (electrical characteristic inspection) device having a shape measuring function may be considered. The etching state judging device 114 has a database for storing a judging program having function of estimating the result of etching by monitored etching parameters and sensor information and data for judgement as a judging system. Further, the etching state judging device 114 is adapted for adding new measuring result and enabling to add and update the judging rule.

As an example of arranging and constituting each of the functions, for example, the etching state is monitored by the etching parameter controlling and monitoring function 111 of the vacuum processing device 1, which is inputted to the judging system of an etching state judging device 114 of the host computer 50. Based on the result of the judgment, the measurement controlling function 120 of the host computer 50 instructs change of the measuring condition within the surface of the wafer to the processing device 1. The vacuum processing device 1 receives the result of measurement, adds new judging rule, instructs the change of the measuring condition, for example, increase or decrease for the number to the measuring device 9, as well as reflects the received result on the judging rule and the database, thereby conducting etching treatment on the wafer 32. On the other hand, the host computer 50 automatically updates the judging system in accordance with the predetermined conditions.

Figure 3:
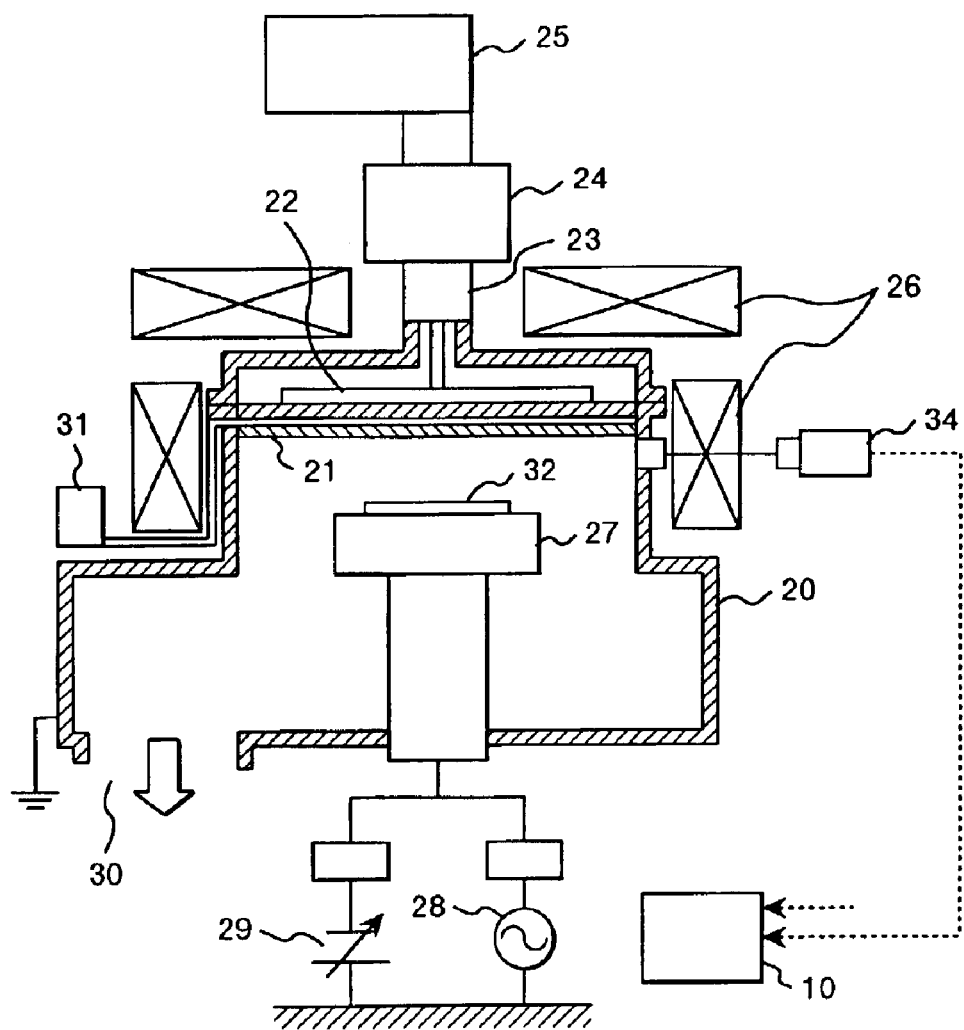
FIG. 3 is a vertical cross sectional view of an etching device adopted in the embodiment shown in FIG. 1.

FIG. 3 is a view showing a vertical cross sectional view of a vacuum processing device as an etching device adopted in the sample processing system according to this invention. The vacuum processing device is an example of an ECR type plasma etching device which emits electromagnetic waves from an antenna and forms a plasma by interaction with magnetic fields in a vacuum processing chamber 20. An antenna 22 made of Al is disposed by way of a dielectric window 21 above the vacuum processing chamber 20. A radio frequency power source 25 that generates UHF electromagnetic waves at a frequency of 450 MHz is connected by way of a coaxial wave guide 23 and a matching device 24 to the antenna 22. A dielectric window 21 disposed between the vacuum processing chamber 20 and the antenna 22 can transmit electromagnetic waves from an RF power source 25. Magnetic field coils (two step coils in this case) for forming magnetic fields in the vacuum processing chamber 20 are wound around the outer periphery of the vacuum processing chamber 20. A lower electrode 27 as a sample bed for placing the wafer 32 as a sample is disposed below the antenna 22 in the vacuum processing chamber 20. A plasma is formed in a processing space between the dielectric window 21 and the lower electrode 27.

A high frequency bias power source 28 for giving an incident energy to ions in the plasmas to the wafer 32, and an ESC power source 29 for electrostatically attracting the wafer 32 to the lower electrode 27 are connected to the lower electrode 27. There is no particular restriction on the frequency of the RF bias power source 28 and it is usually within a range from 200 kHz to 20 MHz. In this case, frequency at 400 kHz is used for the radio frequency bias source 28.

An exhaust port 30 connected with an exhaustion device is disposed to a lower portion of the vacuum processing chamber 20. A gas supply device 31 for supplying a processing gas in the vacuum processing chamber 20 is in communication with plural gas supply holes formed in the dielectric window 21.

For attaining the etching parameter controlling and monitoring function 111, a group of sensors for monitoring etching parameters are provided. They comprise a group of sensors for monitoring process amount during processing such as a gas flow rate supplied to the vacuum processing device, a gas flow rate, a gas pressure and a charged electrode power. Such sensors are usually provided to the dry etching device as a standard installation, which is not illustrated here.

Further, a group of sensors for monitoring the etching processing state is also provided. For example, a light collection window for collecting plasma light corresponding to the plasma generation portion as a processing space of the vacuum processing chamber 20 is disposed and an emission monitor 34 (OES: Optical Emission Spectroscopy) is connected by way of optical fibers in the light collection window for measuring the emission spectrum of the collected plasma light.

As other sensors, QMS (Quadruple Mass Spectrometry) for analyzing the mass of plasma particles may also be provided further. The emission spectra measured by the group of the sensors may be converted into electric signals and inputted to the control device 10.

The factor of changing the etching shape on every wafers may include deposition of reaction products such as Si chloride on the inner wall of the vacuum processing chamber 20, which changes the state of the plasma. For example, when the reaction products deposited on the inner wall are released again and deposited on the wafer, dimensional gain of the fabrication line width from the designed value (hereinafter referred to as "CD gain") increases. When the plasma emission intensity is measured relative to the wavelength of light, that is, emission spectrum is measured simultaneously, change corresponding to the increase of the reaction products is measured. The state of change is different depending on the gas composition or the substances to be etched, and a relation between the CD gain and the emission spectra of the plasma is previously measured and the data is stored and possessed in the memory device of the processing device 10.

Then, description is to be made to the operation of the vacuum processing device system according to this invention. Wafers after etching processing in the vacuum processing device 1 are sent by a transporting manipulator 6 from the lock chambers 4a or 4b to the measuring device 9 for measuring the fabrication line width such as a length measuring scanning electron microscope (hereinafter referred to as "length measuring SEM"). In the measuring device 9, the CD gain is measured by the length measuring SEM. The measurement is conducted optionally on every one sheet, or on every predetermined number of sheets of wafer 1 and data is stored in a memory device of the control device 10. The CD gain has a predetermined allowable value and the initial etching conditions, namely, the etching processing conditions upon starting the lot processing are set such that the CD gain is contained within the allowable value. In a case where a number of wafers have been processed continuously, and when the CD gain exceeds the allowable value, the data signal is sent to the control device 10, the control device 10 automatically controls the etching conditions such that the CD gain is contained within the allowable value, and changes and controls the etching processing conditions in the plasma processing chamber 2a or 2b of the vacuum processing device. The control device 10 controls the feed back (FB) control system or feed forward (FF) control system. Further, the control device 10 also has a database for combining the process amount during processing with the recipe or the production control information (lot number, wafer ID or the like) and storing them as a portion of the etching characteristic accommodation database 113.

Etching processing is applied to the wafers in the etching device 1, and the processed wafers are transported to the measuring device 9. Then, the control device 10 of the etching device 1 requests measurement for the processed wafers to the measuring device 9, and the result of measurement is sent from the measuring device 9 to the control device 10 of the etching device 1. The control device 10 analyzes the result of measurement and sends the same to a host computer of a production line. The host computer conducts predetermined processing based on the result of the measurement and instructs the change of the measuring conditions by the measuring device 9. On the other hand, wafers completed with measurement are transported to the next step.

As an example of changing the measuring conditions, FIG. 4A shows an example of increasing the measuring points within a surface of a wafer. As the number of measuring points is larger, distribution of the etching characteristics within the wafer surface, for example, difference of the cooling temperature can be recognized better. Further, in FIG. 4B, the measurement position at the measuring point is changed from one to multiple points regarding measurement for the fabrication shape of the wafer. State of the CD gain can be recognized well by the multi-point measurement.

Further, as another example of changing the measuring conditions, a measuring instrument may be switched to those of higher accuracy when abnormality is forecast. An example can include a case of usually measuring by an OCD (Optical CD measuring instrument), which is then switched to measurement by CD-SEM when abnormality is forecast.

As described above, the accuracy for measuring the wafers by the measuring device 9 is enhanced as the number of measuring points within the wafer surface or the number of measuring points regarding the fabrication shape is larger. However, when the measuring accuracy is improved, it takes more time for measurement to lower the throughput. Then, it is desirable that processing is made at a measuring accuracy as low as possible just after starting etching thereby improving the throughput, the aging change or the like of the circumstance in the processing chamber is monitored and the measuring accuracy is properly increased in accordance with the requirement.

EXAMPLE 1

Figure 5:
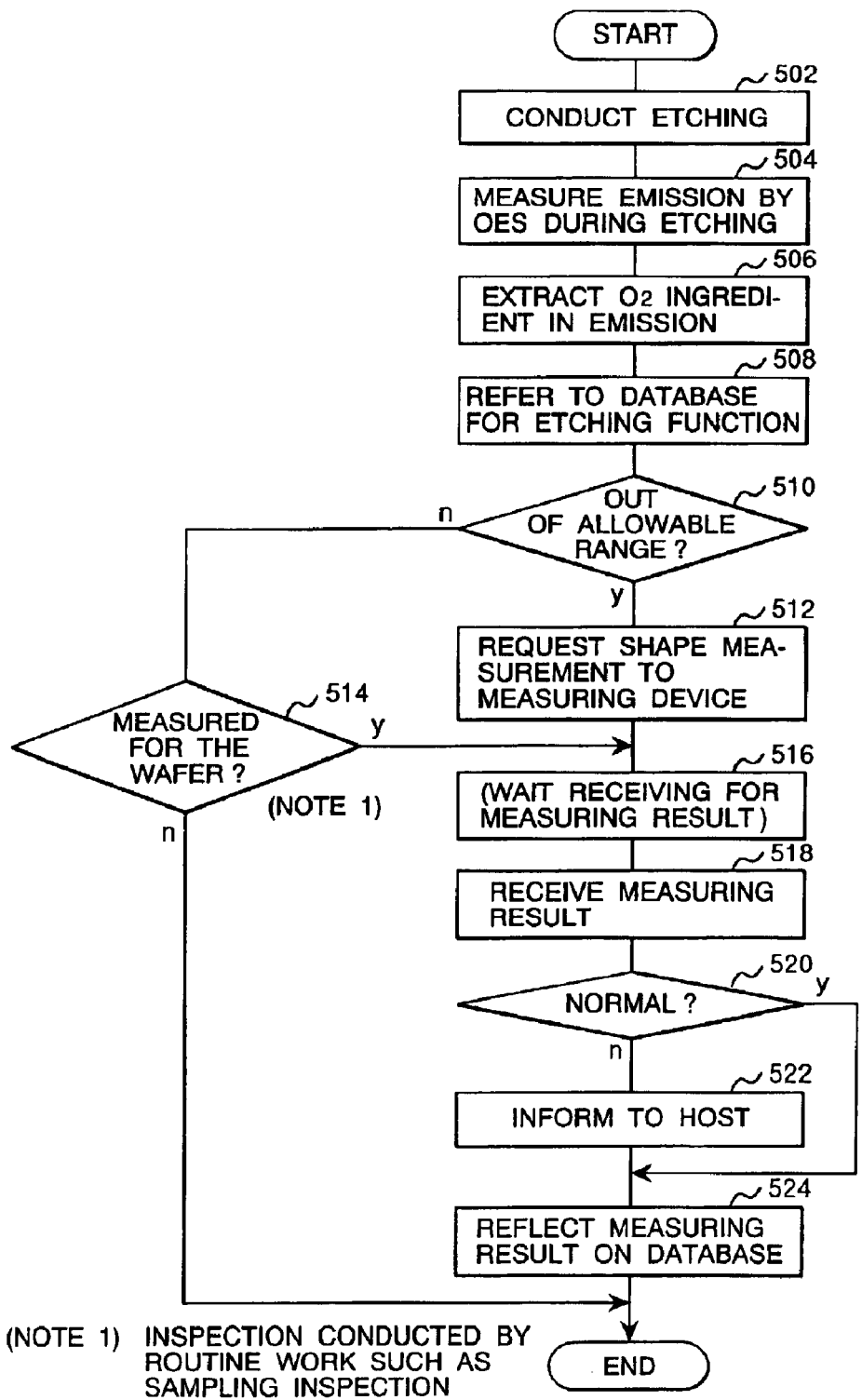
FIG. 5 is an explanatory view showing an actual control flow of Embodiment 1 according to this invention.

A more concrete example of this invention is to be described as Example 1 with reference to the control flow in FIG. 5 and an $O_2$ ingredient amount characteristic database 116 (a portion of etching characteristic storing database 113) of FIG. 6. Generally, it is considered that the amount of $O_2$ ingredient gives an effect on the shape of etching in Poly-Si etching. Then, a relation between the amount of $O_2$ ingredient and the shape is previously formed into a database. During etching processing (step 502), plasma emission is examined by an emission monitor OES (504) to measure the fluctuation of the amount of $O_2$ ingredient therein (506), this can forecast the finished etching shape. Then, the database 116 for the relation between the amount of $O_2$ ingredient and the shape shown in FIG. 6 is referred to (508), and it is judged whether the shape is out of the standard or not by the emission amount during etching (510), and measurement of the shape regarding a wafer which is considered to be out of the standard is requested to the measuring device 9 (512). Further, even when the wafer is not out of the standard, inspection is also conducted as a routine work, for example, by sampling inspection (514). Information of the measuring device 9 on each wafer is utilized optionally also in the succeeding step.

It is defined that the amount of $O_2$ ingredient in the $O_2$ ingredient amount characteristic database 116 represents a relative value from the standard state. The result of measurement in the measuring device 9 is received by communication (516, 518). Then, it is judged whether the result of measurement is normal or not (520). In the $O_2$ ingredient amount characteristic database 116 of FIG. 6(a), an area surrounded with a heavy line is an allowable range. If it is abnormal, this is informed to the HOST computer, in this example (522), and the HOST computer 50 instructs a countermeasure, for example, operation termination or conduction of cleaning for the processing apparatus.

Further, irrespective that the result of measurement in the measuring device 9 is normal or abnormal, or also in a case of request from the etching device 1, all the result of usual sampling inspection are reflected on the database 106 of FIG. 6 (524) as well. In this example, information that the result of new measurement (−7.5%) less than the data of −10% is out of the allowable range is added to the database as shown in FIG. 6(b). This can make the lower limit boundary for the allowable range more distinct thereby making the judgement for the requirement of inspection more exact. As described above, by updating the judging rule for the judging program or the database in accordance with the result of measurement, it is intended to improve the accuracy of the function of estimating the result of etching from the monitored etching parameters and the sensor information. This can improve the forecast accuracy by the judging program and, accordingly, improve the yield of products. Further, throughput in the wafer processing can be improved by determining the measuring accuracy in accordance with the etching conditions.

In this example, while the etching device is provided with the database and the forecasting function described above, the function may be provided by the host computer. Alternatively, the forecasting function and the database sensor may be integrated with the sensors and provided in the form of a line monitoring device.

EXAMPLE 2

Figure 7:
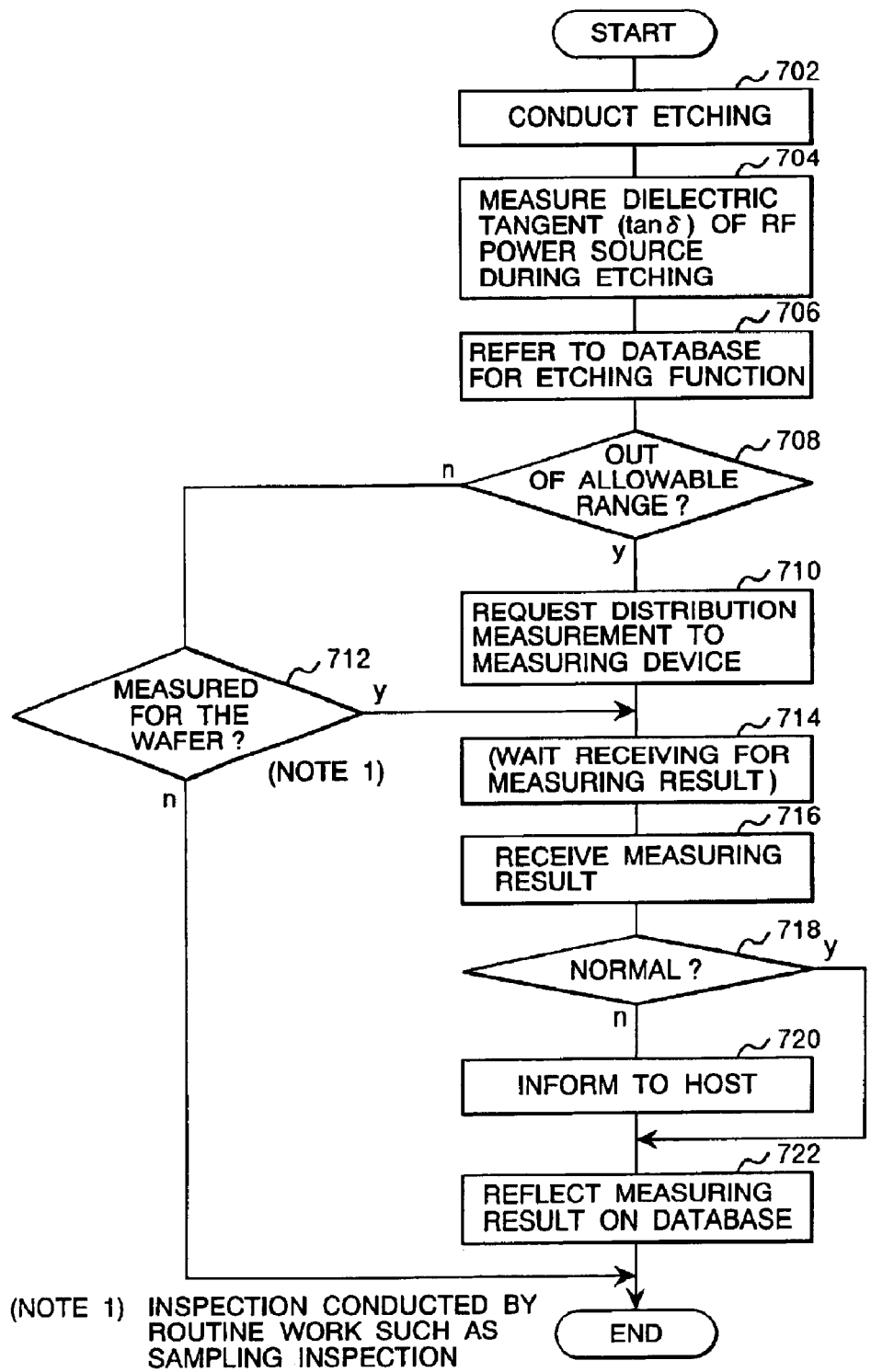
FIG. 7 is an explanatory view showing an actual control flow of Embodiment 2 according to the present invention.

Example 2 according to this invention is to be described with reference to the control flow of FIG. 7 and the dielectric tangent characteristic database 118 of FIG. 8 (a portion of etching characteristic storing database 113).

In UHF plasma etching device, it is generally considered that UHF power value gives an effect on the etching uniformity (distribution characteristic within the wafer surface). Usually, while the power value is controlled constant, not all the power contributes to the generation of the plasma but a portion of the power is not incident in the processing chamber for example by reflection. As an index of expressing the efficiency, a dielectric tangent (tan δ) shown in the database of FIG. 8 is used frequently. While tan δ is also substantially constant usually, the value varies depending on the fluctuation of the state of the device. In view of the above, the etching uniformity can be forecast by measuring tan δ during the etching processing of wafers.

That is, during etching processing of wafers (step 702), the dielectric tangent (tan δ) of an RF power source is measured (704). Thus, finished etching shape can be forecast. Then, referring to the dielectric tangent characteristic database 118 in FIG. 8(a) (706) for the relation between the tan δ and the uniformity, it is judged whether the uniformity is out of the allowable range or not by the dielectric tan δ during etching (708). In the dielectric tangent characteristic database 118 of FIG. 8(a), an area surrounded with a heavy line is an allowable range. For the wafer which is considered to be out of the allowable range, distribution measurement thereof is requested to the measuring device 9 (710). Further, if it is not out of the standard, inspection is also conducted as a routine work, for example, by wafer sampling inspection (712).

The distribution is measured by increasing the position for the measurement within the wafer surface in addition to usual measuring points. The control device 10 receives the result of measurement (714–716), judges whether the result of measurement is normal or not (718) and judges whether the uniformity is present or not again referring to the dielectric tangent characteristic database 118 of FIG. 8(a). If it is abnormal, information is sent, in this example, to the HOST computer (720) and HOST computer instructs a countermeasure such as operation termination or conduction of cleaning for the processing apparatus.

Figures 8A, 8B:
FIG. 8 is an explanatory view showing an example of a database of Embodiment 2.

Further, irrespective that the result of the measurement in the measuring device 9 is normal or abnormal, or also in a case where the request is made from the etching device 1, all the result of usual sampling inspection are reflected on the database as well to be utilized for the improvement of the forecasting accuracy (722). In this example, as shown in FIG. 8(b), the information that a result of new measurement (−6%) larger than the date of −5% is within an allowable range is added to the database. In this way, by updating the judgment rule of the judging program or the database in accordance with the result of measurement, it is intended for the improvement of the accuracy of the function of forecasting the result of etching from the monitored etching parameters and the sensor information. This can improve the forecasting accuracy by the judging program and, thus, improve the yield of the products. Further, the throughput in the wafer processing can be improved by defining the measuring accuracy depending on the etching conditions.

It will be apparent that this invention is applicable also to other sample processing apparatus such as plasma CVD apparatus, sputtering apparatus, ashing apparatus and ion implantation apparatus.

According to this invention, since the processing conditions or the processing state of the samples are monitored to conduct feed back control or feed forward control to the sample processing apparatus or sample measuring device, that is, the judging rule of the judging program or the database are updated in accordance with the result of measurement for the sample, accuracy for the improvement of the function of estimating the result of processing for the samples based on the monitored values is improved. This can improve the forecasting accuracy by the judging program and, thus, improve the yield of the products. Further, throughput can be improved by defining the measuring accuracy in accordance with the processing conditions of the samples.

What is claimed is:

1. A sample processing apparatus comprising:
a function of monitoring processing parameters for samples;
a function of estimating the processing characteristics of the samples based on the monitored parameters;
a function of conducting communication with a measuring device for measuring the processing state of the samples after processing; and
a function of updating measuring conditions by the measuring device in accordance with the processing characteristics of the samples estimated from the information by monitoring.

2. A sample processing apparatus comprising:
a function of monitoring processing parameters of samples;
a sensor function of monitoring the processing state of the samples;
a function of estimating the processing characteristics of the samples from the monitored parameters and the processing state;
a function of conducting communications with a measuring device for measuring the characteristics of the sample after processing; and
a function of changing the measuring conditions by the measuring device based on the processing characteristics estimated from the processing parameters and the sensor information.

3. A sample processing apparatus according to claim 1 or 2 further comprising:
a function of monitoring parameters regarding the etching processing of samples;
a sensor function of monitoring the etching state of the sample;
a function of estimating the etching characteristics of the samples based on each of the monitored parameters;
a function of conducting communication with a measuring device for measuring etching characteristics of the sample after processing; and
a function of changing the measuring conditions by the measuring device based on the etching characteristic estimated from the etching parameters and the sensor information.

4. A sample processing apparatus according to claim 3, having a database for storing a judging program having a function of estimating the result of etching by the monitored etching parameters and sensor information, and data for judgment.

5. A sample processing apparatus according to claim 4, having a judging system capable of judging a new result of measurement and adding a judging rule.

6. A sample processing apparatus according to claim 1 or 2, wherein increase or decrease for the number of measuring points within a wafer surface is conducted as the change for the measuring conditions by the measuring device.

7. A sample processing apparatus according to claim 1 or 2, wherein the measuring position at any one of the measuring point is changed to a single point or multiple points as the change for the measuring conditions by the measuring device.

8. A sample processing system having a sample processing apparatus, in which a measuring device and a host computer connected with each other by way of a communication circuit,
the system comprising:
a function of monitoring the processing state in the sample processing apparatus; and
a judging system for judging the monitoring result based on a judging rule and a database,
wherein the judging system instructs change of the measuring conditions to the measuring device based on the result of judging by monitoring the processing state of the samples in the sample processing apparatus, receives the result of measurement after the change and reflects the same on the judging rule and the database thereby automatically updating the judging system while conducting processing for the samples.

9. A sample processing system according to claim 8, which monitors the etching state in the sample processing apparatus by using a function of monitoring the etching state, inputs the result of monitoring to the judging system, instructs change of the measuring conditions to the measuring device based on the result of judgement by the communication function, receives the result of measurement, and reflects the received result of measurement on the judging rule and the date base, thereby automatically updating the judging system while conducting etching processing for the samples.

* * * * *